United States Patent

Yoshioka et al.

(10) Patent No.: US 6,491,832 B2
(45) Date of Patent: *Dec. 10, 2002

(54) METHOD FOR PROCESSING SPECIMENS (75) Inventors: Ken Yoshioka, Hikari (JP); Yoshimi Torii, Tokyo (JP); Moriaki Fuyama, Hitachi (JP); Tomohiro Okada, Odawara (JP); Saburou Kanai, Hikari (JP); Takehito Usui, Chiyoda-machi (JP); Hitoshi Harata, Utsunomiya (JP)

(73) Assignees: Hitachi, Ltd., Tokyo (JP); Hitachi Metals, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/493,103
(22) Filed: Jan. 28, 2000
(65) Prior Publication Data
US 2002/0129900 A1 Sep. 19, 2002

(30) Foreign Application Priority Data
Oct. 8, 1999 (JP) .............................................. 11-288658

(51) Int. Cl.$^7$ ............................. B44C 1/22; C03C 15/00
(52) U.S. Cl. .............................. 216/22; 216/67; 216/75; 29/607
(58) Field of Search ......................... 156/345; 118/719; 216/22, 63, 67, 75; 29/607

(56) References Cited

U.S. PATENT DOCUMENTS

| | | | | | |
|---|---|---|---|---|---|
| 5,186,718 A | * | 2/1993 | Tepman et al. | ............ | 29/25.01 |
| 5,607,599 A | * | 3/1997 | Ichihara et al. | ................ | 216/22 |
| 6,024,885 A | * | 2/2000 | Pendharkar et al. | .......... | 216/22 |
| 6,244,811 B1 | * | 6/2001 | Kroeker et al. | ............. | 414/217 |

* cited by examiner

*Primary Examiner*—Gregory Mills
*Assistant Examiner*—Luz Alejandro
(74) *Attorney, Agent, or Firm*—Antonelli, Terry, Stout & Kraus, LLP (57) ABSTRACT

A method of processing specimens, an apparatus therefor, and a method of manufacture of a magnetic head are provided wherein a complicated conventional post processing step for removing corrosion products is eliminated by a corrosion prevention processing for removing only a residual chlorine compound produced in the gas plasma etching. More specifically, the method is comprised of the steps of: forming a lamination film including a seed layer made of NiFe alloy, an upper magnetic pole made of NiFe alloy connected to the seed layer, a gap layer made of oxide film in close contact with the seed layer, and a shield layer made of NiFe alloy in close contact with the gap layer; plasma-etching the seed layer with a gas which contains chlorine using the upper magnetic pole as a mask; and after that removing the residual chlorine compound by a plasma post treatment with a gas plasma which contains H2O or methanol.

4 Claims, 7 Drawing Sheets

METHOD FOR PROCESSING SPECIMENS

BACKGROUND OF THE INVENTION

The present invention relates to a method of processing a specimen using a plasma etching process, an apparatus therefor, and a method of manufacture of a magnetic head using the same.

A specimen, such as a substrate of a semiconductor device and the like, is subjected to etching processing, for example, using a chemical solution or plasma. In such etching processing of the specimen, it is necessary to pay sufficient attention to the occurrence of corrosion in the specimen after the etching processing.

As such anti-corrosion technology for the specimen after the etching processing, there is a known technique as disclosed, for example, in JP-A Laid-Open No. 59-186326, wherein any chlorine compound, which is a corrosive substance remaining in resist films and the like is removed by ashing processing of the resist films using a plasma in a plasma process chamber which is in communication with an etching chamber that is maintained in a vacuum. Further it is known that, by heating the specimen after etching at 200° C. or more, evaporation of the chlorine compound, which is a corrosive substance remaining in the specimen, is promoted, thereby preventing the occurrence of corrosion of the specimen after etching. Further, there is also a known process, as disclosed in JP-A Laid-Open No. 61-133388, wherein an object to be treated, such as a specimen which has been etched, is transferred from the etching chamber to a heat treatment chamber in which the object to be treated is dried by blowing heated air over it, then it is taken out of the heat treatment chamber to be rinsed with water and then dried, thereby preventing the corrosion of the object after its etch processing due to reaction with the atmosphere.

JP-A Laid-Open No. 2-224233 discloses a method for processing specimens, which method is comprised of: a first step of etching a specimen, in the form of a lamination which contains different metals each having a different ionization characteristic from the other, using a first gas plasma via a resist mask formed on the lamination specimen in a first processing chamber; a second step of removing the resist mask and residual corrosion substances deposited on a side wall of the laminated specimen containing metals having different ionization characteristics from each other, which are formed in the first step, by processing the specimen in a second processing chamber using a second gas plasma formed in a different gas atmosphere from that of the first gas plasma; and a third step of removing a remaining portion of the residual corrosive substances deposited on the side wall of the laminated specimen which could not have been removed by the second step, by causing surfaces of the specimen which are exposed by the first and the second steps to come into contact with at least one liquid. According to this method, in the first step, the specimen which is prepared by laminating an Al alloy film and a TiW or TiN film is etched using a gas plasma which contains chlorine via the resist mask under decompression; in the second step, the specimen is subjected to an ashing process using a gas plasma which contains oxygen; and in the third step, the specimen is rinsed with water, and wherein in order to remove the residual corrosive substances remaining after the first step, the third step is comprised of at least one of the steps of: (a) rinsing in water; (b) further rinsing in water after rinsing in an alkaline liquid; (c) still further rinsing in water after rinsing in an acidic liquid, and (d) rinsing in water after rinsing in a fluoro-acid solution.

A method of etching a material used for magnetic poles in a thin film magnetic head, magnetic sensor and the like, which contains Fe, is disclosed in JP-A Laid-Open No. 4-107281. In this publication, a method of etching alloys which contain Fe, in particular, Fe—Si—Al alloy, formed on a surface of a specimen is disclosed, which method is comprised of: a step of etching a specimen which is heated in a vacuum at a temperature which is above 250° C. and below its melting point in an atmosphere of chlorine gas by a reactive ion milling method; a step of post-processing the specimen which is maintained at a high temperature above 250° C. by applying a chlorine ion shower thereto in order to allow for etching residuals remaining on the surface of the specimen to completely react with the chlorine gas; and a step of pure water processing for dissolving and removing etching products which are produced in the post processing step by submerging the specimen in pure water, wherein the above-mentioned steps are executed consecutively in the sequence described above.

Further, JP-A Laid-Open No. 7-93293 discloses a method which is comprised of the steps of: etching a specimen formed of a lamination of wired material which contains aluminum; then removing halogen compounds and resist compounds at the same time.

A problem associated with the technique indicated in JP-A Laid-open No. 4-107281 resides in the fact that, in a case where pure Fe which is 3 $\mu$m thick is etched by argon ion milling for the manufacture of a magnetic head, because the etching rate is approximately 150 A/min, it takes 200 min. This is because the etching rate is controlled by the number of incident ions. In order to improve the etching rate, it is suggested in JP-A Laid-open No. 4-107281 that by heating a specimen above 250° C., and by applying reactive ion milling in a chlorine gas atmosphere, the etching rate can be improved approximately to 1000 A/min. However, there is a problem in that some types of specimens cannot withstand a temperature above 250° C. depending on the materials, thereby preventing application of the above-mentioned method. In particular, there arises a problem when etching a laminated film which contains a ferromagnetic material of NiFe alloy for use in the manufacture of a magnetic head in that, if the temperature of its specimen rises above 230° C., the magnetic property of its NiFe film is deteriorated, and even when its temperature drops to the normal temperature, its original magnetic property cannot be recovered, thereby rendering it useless.

Still further, an anti-corrosion process is proposed for preventing corrosion which occurs in a specimen which is left after application of reactive ion milling in JP-A Laid-Open No. 4-107281, comprising: a post-treatment process for applying a chlorine ion shower onto the specimen which is heated at a temperature above 250° C.; and a pure water immersion process for immersing the specimen in pure water, wherein the above-mentioned processes are executed sequentially in this order. However, there is a problem in that the temperature of the specimen rises above 250° C., and a complicated sequence of anti-corrosion processing, including the ion shower and then the pure water immersion processes, is required, thereby increasing the cost of manufacture.

The above-mentioned complicated sequences for corrosion prevention processes are considered to be due to the fact that the specimen target, which is a Fe—Si—Al alloy and contains two different metals which differ greatly in ionization characteristics from each other, as indicated in JP-A Laid-open No. 2-224233, has a high corrosiveness.

SUMMARY OF THE INVENTION

An object of the present invention is to provide a method of processing a specimen for corrosion prevention thereof, an apparatus therefor and a method of manufacture of a magnetic head using the same, which allows for etching of a specimen, such as a laminated film containing NiFe alloy, at a high rate and at a temperature which is low enough not to destroy the device, in a simple manner and at a low cost.

A method for accomplishing the object of the invention is comprised of the steps of: etching a specimen, for example, a magnetic pole for a magnetic head, which is formed using NiFe alloy, after plasma processing the same using a relatively high density plasma source; and subjecting the specimen to a post-plasma processing for corrosion prevention immediately after the etching, using a gas plasma which contains $H_2O$ or methanol, under a pressure at 50 Pa or above, at a temperature of the specimen below 200° C.

Here, the relatively high density plasma source refers to an induction-coupled type plasma apparatus, helicon type plasma apparatus, two-frequency excitation parallel plane type plasma apparatus or microwave type plasma apparatus, which can irradiate a specimen with a plasma of a saturated ion current density of approximately 1–10 $mA/cm^2$. Compared to the conventional low density plasma source, such as ion milling and parallel plane types, this has a plasma density as high as 10 to 100 times greater. Further, because another high frequency power source is provided to a specimen stage in addition to a high frequency power source for plasma production, ion energy to be input to the specimen can be controlled independently. If this plasma source of the invention is used, because it ensures that a sufficient number of incidence ions will be produced, it becomes possible to obtain a high etching rate even if the energy of the ions of incidence is set at 50–500 eV, or from ½ to 1/10 of the milling method, and at a lower temperature of the specimen. For example, an etching rate of 100 nm/min can be realized at 40° C. of the specimen and at 300 eV of ion energy. Also, there is a merit if the temperature of the specimen is held in a range from 40 to 60° C. that the design and construction of its specimen's stage is simplified thereby contributing to a reduction of the cost of manufacture.

Further, in the high density plasma processing of the invention, because of a shallowness of penetration of chlorine ions bombarded into an NiFe alloy layer due to a low bombardment ion energy, and because Ni and Fe are the same type of metals having the same ionization characteristics, thereby preventing the above-mentioned corrosion mechanism due to the different ionization characteristics from occurring, corrosion prevention of the specimen becomes possible by removing residual chlorine compounds deposited on the surface of the specimen after etching thereof by exposing the same to a gas plasma containing $H_2O$ or methanol under a pressure of 50 Pa or more, and at a temperature of the specimen below 200° C., and thereby providing for a simpler and lower cost corrosion prevention method and an apparatus therefor.

Also, the lamination film used for manufacture of the magnetic head includes, in addition to NiFe alloy film, oxide film layers such as alumina, oxide silicon film and the like, and/or various other layers such as a photo-resist layer and the like, which are to be processed by etching in a plasma. However, in the etching thereof, there arises a case where its NiFe alloy layer is exposed from its under-layer, or where its oxide film layer is etched using the NiFe alloy layer itself as a mask. During such processes, the NiFe alloy layer is exposed to a chlorine or fluorine plasma atmosphere. Therefore, a post-etching corrosion prevention treatment is required. For these etching processes, the corrosion prevention treatment by exposing the specimen to a gas plasma containing $H_2O$ or methanol according the invention can be applied as well.

The method and the apparatus to be provided according to the invention will be more specifically described in the following.

A method of processing a specimen according to the invention is comprised of: a first step of etching a laminated film formed on a substrate, which contains at least one layer comprising a NiFe alloy or NiFeCo alloy by applying a gas plasma which contains chlorine, at a temperature of the specimen below 200° C. in an etching chamber; and a second step of plasma post-processing for removing residual chlorine compounds deposited on the lamination layer by applying a gas plasma which contains $H_2O$ or methanol on the lamination films exposed by the first step, under a pressure at 50 Pa or more and at a temperature of the specimen below 200° C.

The present invention further provides for a method of processing the specimen, wherein its gas plasma is produced by at least one or more in combination selected from the group consisting of $Cl_2$, $BCl_3$, Ar and $O_2$.

The invention provides for a method of processing the specimen, wherein the other lamination layer is comprised of at least one of (A) a photo-resist layer, (B) an alumina ($Al_2O_3$) layer, (C) a silicon oxide layer, (D) a Cu layer, (E) a Ta layer, and (F) a Cr layer, which are to be etched by a gas plasma in an etching chamber.

According to another aspect of the invention, a method of etching the specimen in an etching chamber is provided, which specimen is comprised of a sintered substrate made of $Al_2O_3$ and TiC, and a layer of NiFe alloy formed on the substrate.

According to still another aspect of the invention, a method of manufacture of a magnetic head having an upper magnetic pole and a lower magnetic pole disposed opposite to the upper magnetic pole is provided, which is comprised of the steps of: forming a lamination film which is comprised of an upper photo-resist layer, a hard mask of $SiO_2$ or alumina, a lower photo-resist layer, and a seed layer of NiFe alloy; plasma-etching the hard mask layer using the upper photo-resist layer as a mask; forming a deep groove by plasma-etching in the lower photo-resist layer using the hard mask layer as a mask with a gas which contains chlorine so as to expose the seed layer in the bottom of the deep groove; removing a residual chlorine compound which is deposited on an exposed portion of the seed layer by a plasma post-treatment using a gas plasma which contains $H_2O$ or methanol; then, embedding a NiFe alloy into the deep groove to make contact with the seed layer.

According to a still further aspect of the invention, a method of manufacture of a magnetic head having an upper magnetic pole and a lower magnetic pole disposed opposite to the upper magnetic pole is provided, which is comprised of the steps of: forming a lamination film which is comprised of a seed layer made of NiFe alloy, an upper magnetic pole made of NiFe alloy which is in contact with the seed layer, a gap layer of an oxide film in close contact with the seed layer, and a shield layer made of NiFe alloy in close contact with the gap layer; plasma-etching the seed layer using the upper magnetic pole as a mask with a gas which contains chlorine; then, removing a residual chlorine compound by a plasma post-treatment with a gas plasma which contains $H_2O$ or methanol.

According to a still further aspect of the invention, a method of manufacture of a magnetic head having an upper magnetic pole and a lower magnetic pole disposed opposite to the upper magnetic pole is provided, which is comprised of the steps of forming a lamination f film which is comprised of a seed layer made of NiFe alloy, an upper magnetic pole made of NiFe alloy which is in contact with the seed layer, a gap layer of an oxide film in close contact with the seed layer, and a shield layer made of NiFe alloy in close contact with the gap layer; etching the seed layer; plasma-etching the gap layer using the upper magnetic pole as its mask with a gas compound which contains chlorine or fluorine, then; removing a residual chlorine compound by a gas plasma which contains $H_2O$ or methanol.

According to a still further aspect of the invention, a method of manufacture of a magnetic head having an upper magnetic pole and a lower magnetic pole disposed opposite to the upper magnetic pole is provided, which is comprised of the steps of: forming a lamination f film which is comprised of a seed layer made of NiFe alloy, an upper magnetic pole made of NiFe alloy which is in contact with the seed layer, a gap layer of an oxide f film in close contact with the seed layer, and a shield layer made of NiFe alloy in close contact with the gap layer; etching the seed layer; etching the gap layer; trim-etching the shield layer using the upper magnetic pole as its mask by plasma treatment with a gas compound which contains chlorine, then; removing a residual chlorine compound by a plasma post-treatment with a gas plasma which contains $H_2O$ or methanol.

According to still another aspect of the invention, a method of manufacture of a magnetic head having an upper magnetic pole and a lower magnetic pole disposed opposite to the upper magnetic pole is provided, which is comprised of the steps of: forming a lamination f film which is comprised of a seed layer made of NiFe alloy, an upper magnetic pole made of NiFe alloy which is in contact with the seed layer, a gap layer of an oxide film in close contact with the seed layer, and a shield layer made of NiFe alloy in close contact with the gap layer; plasma-etching each of the seed layer, the gap layer and the shield layer exclusively in each vertical direction thereof using the upper magnetic pole as a mask; and removing a residual chlorine compound deposited on a processed surface by a plasma post-treatment with a gas plasma which contains $H_2O$ or methanol.

According to still another aspect of the invention, a method of manufacture of a magnetic head is provided, wherein the gap layer is processed with a gas plasma which contains chlorine or fluorine, and the seed and the shield layers are processed with a gas plasma which contains chlorine and argon gas.

According to one aspect of the invention, an apparatus for etching a specimen which is laminated on a substrate is provided, which is comprised of: an etching processing device, which is supplied with a gas for forming a plasma, and generates a gas plasma, for etching a laminated film which includes at least one layer made of NiFe alloy or NiFeCo alloy formed on a substrate by a gas plasma which contains chlorine at a temperature below 200° C. of the specimen in an etching chamber; and a plasma post-treatment device for removing a residual chlorine compound deposited on the layers made of NiFe alloys exposed by the etching processing with a gas plasma which contains $H_2O$ or methanol, under pressure below 50 Pa and at a temperature below 200° C.

According to another aspect of the invention, an apparatus for processing a specimen is provided, which is comprised of: an atmospheric loader; a vacuum transport chamber including a vacuum transport robot provided therein; and unload and load lock chambers which connect between the atmospheric loader and the vacuum transport chamber, and transfer the specimen therebetween, wherein the vacuum transport chamber is connected to the etching chamber of the etching processing device, and the atmospheric loader is connected to the plasma post-treatment chamber of the plasma post-treatment device.

Further, the etching chamber according to the invention is provided with a plurality of processing devices for processing the specimen.

BRIEF DESCRIPTION OF THE DRAWINGS

Other features and advantages of the invention will be apparent from the following description taken in connection with the accompanying drawing wherein.

PREFERRED EMBODIMENT OF THE INVENTION

A preferred embodiment of the invention will be described in detail with reference to the accompanying drawings.

Figure 1:
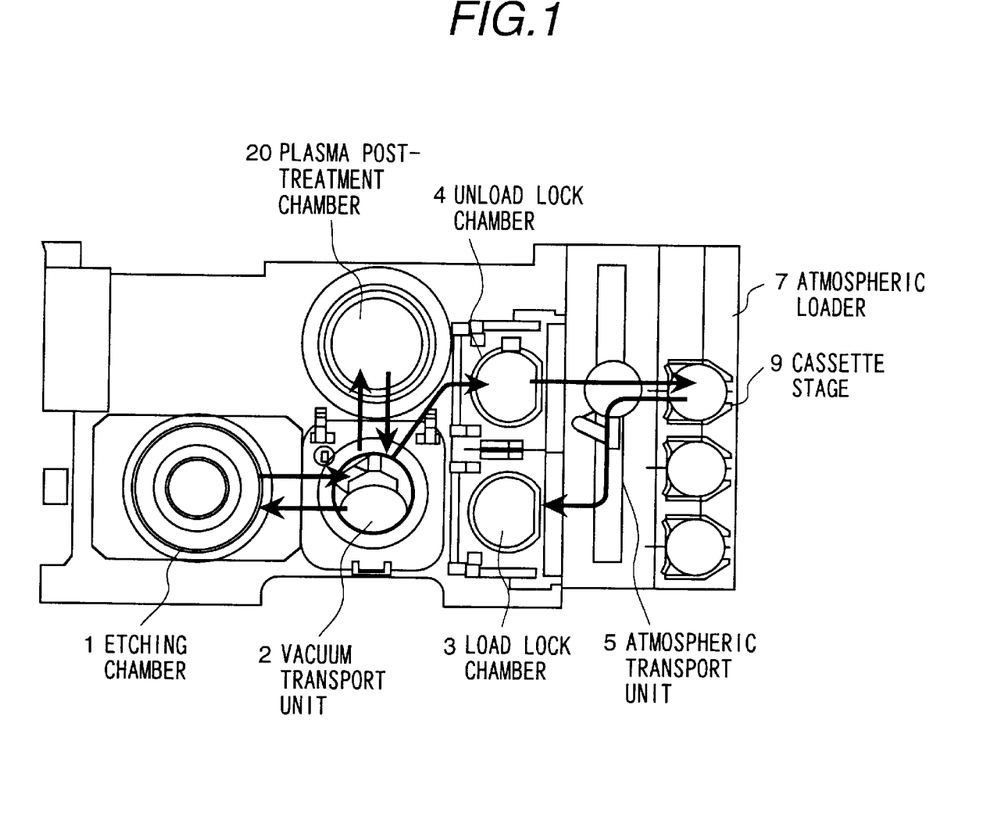
FIG. 1 is a schematic diagram of an embodiment of the invention.
Figure 2:
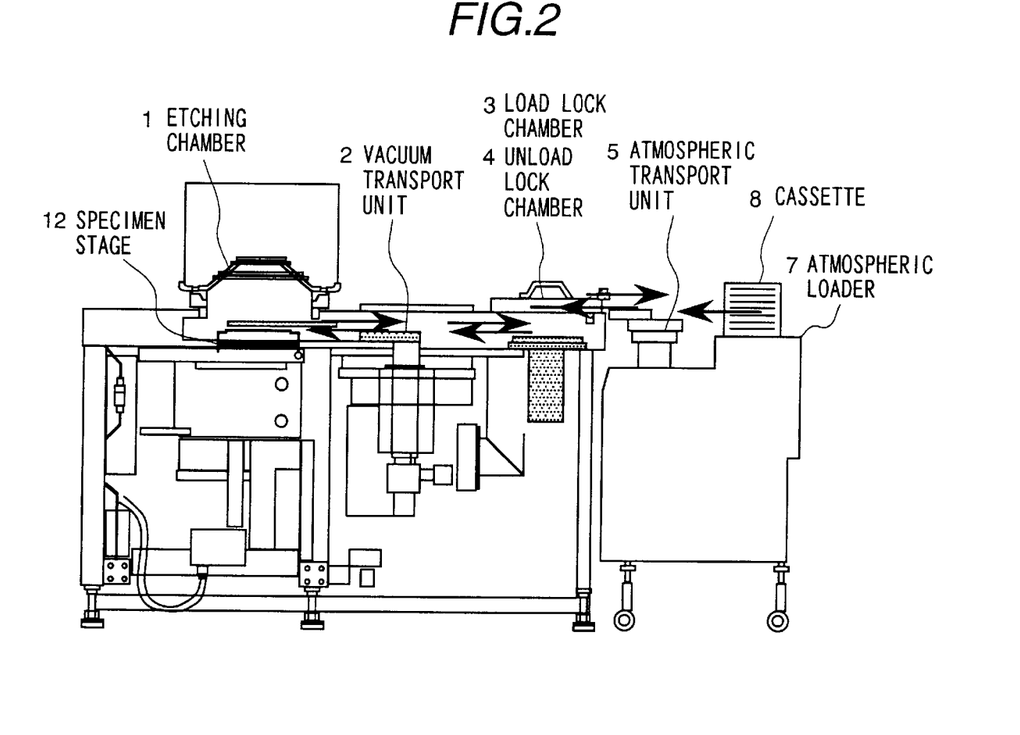
FIG. 2 is a front view of the embodiment of the invention in FIG. 1.

FIG. 1 shows a schematic construction of an embodiment of the invention, and FIG. 2 shows a part of the construction, which is subjected to a vacuum, of FIG. 1. An apparatus for processing a specimen in these figures is comprised of: an etching processing unit 1; a vacuum transport unit 2; a load lock chamber 3; an unload lock chamber 4; an atmospheric transport unit 5; a post-plasma treatment unit 20; an atmospheric loader 7; and a cassette 8.

As etching processing unit 1, a device for processing a specimen by etching using a high density plasma under decompression is used. For example, an induction coupling plasma etching device, a helicon type plasma etching device, a three-frequency excitation parallel plane type plasma etching device, a microwave plasma etching device or the like may be used.

A post-treatment gas is introduced into a process chamber of a post-plasma treatment unit 20 at a predetermined flow rate, and a portion of the post-treatment gas is exhausted from the post-treatment chamber, thereby ensuring that the pressure of the treatment chamber will be adjusted at a predetermined post-treatment pressure. Then, plasma is generated from the post treatment gas present in the treatment chamber under a high frequency electric field by action, for example, of microwave or induction coupled high frequencies. The specimen placed on a specimen stage (not shown) after etching processing is subjected to a post processing using this plasma. Upon completion of the post processing of the specimen after it has been etched, the introduction of the post processing gas and the production of plasma from the post processing gas are stopped.

Figure 3:
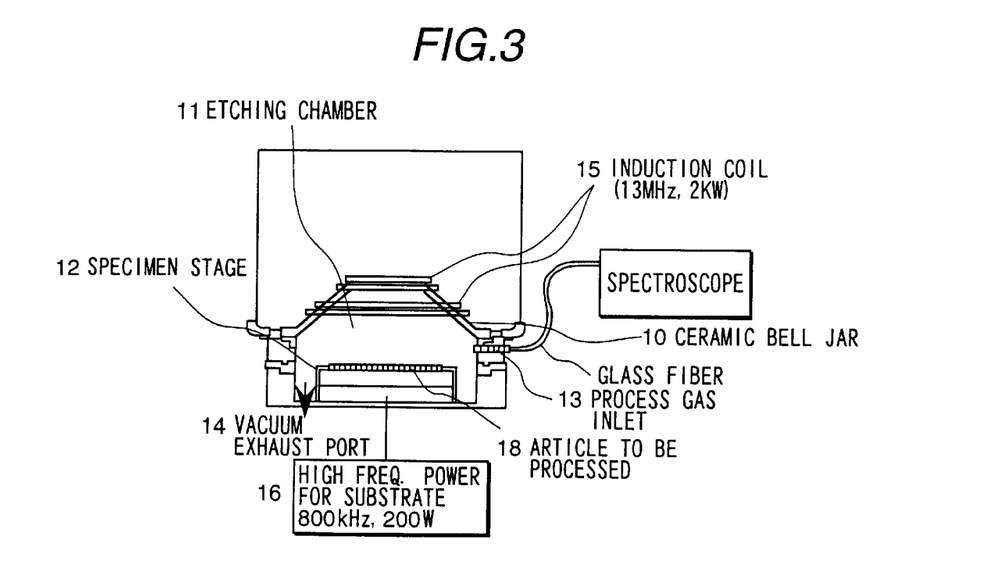
FIG. 3 is a diagram of an etching processing apparatus of the invention.
Figure 4:
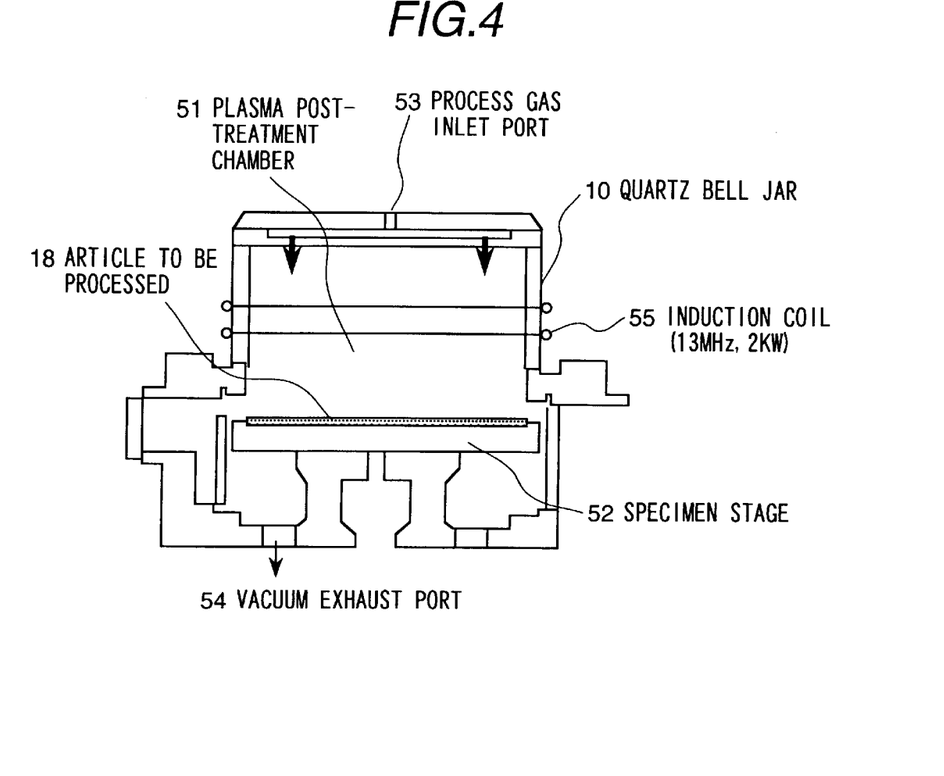
FIG. 4 is a diagram of a post-plasma treatment apparatus of the invention.

Examples of the constructions of the etching processing unit 1 and of plasma post processing unit 20 are indicated in FIGS. 3 and 4, respectively.

With reference to FIG. 3, etching processing unit 1 is comprised of: etching processing chamber 11 formed by an alumina ceramic or quartz bell jar 10; a specimen stage 12; a process gas introduction port 13; vacuum exhaust port 14; and an induction coil 15 (for example, 13 MHz, 2 KW), wherein the specimen stage 12 is used to mount an article 18 to be processed, such as a magnetic pole material, as will be described later. Further, specimen stage 12 is connected to a high frequency unit 16 (for example, of 800 kHz, 200 W). A gas of low pressure, such as approximately 0.1–2 Pa, is used.

With reference to FIG. 4, plasma post-treatment unit 20 is comprised of: a post-treatment chamber 51 composed of a quartz bell jar 10; a specimen stage 52; a process gas inlet port 53; a vacuum exhaust section 54; and an induction coil (for example, of 13 MHz, 2 KW) 55, wherein article 58 to be processed, such as the magnetic pole material which will be described later, is mounted on stage 52 to be subjected to a post-treatment. Further, specimen stage 52 is designed to allow for its temperature to be adjusted from 50 to 200° C. such that the specimen can be maintained at a predetermined temperature below 200° C. A gas which is to be used includes $H_2O$, $CH_3OH$, $NH_3$ or the like, which vaporizes under decompression, and is used together with an addition gas, for example, such as oxygen. A gas pressure, in the case of a post treatment, is set at a relatively high pressure of 50–200 Pa. This is because the aforementioned pressure is preferable in order to produce hydrogen atom radicals rather than plasma by plasma discharge and gas dissociation.

In case ion milling or low density plasma is used, a selectivity ratio with respect to a mask becomes low. For example, a selectivity ratio as high as 1.0–10.0 can be obtained when a high density plasma is used for etching $Al_2O_3$ via a mask of NiFe compared to a selectivity ratio of 0.2–1.0 when a low density plasma is used. This is because an incident ion energy in the low density plasma becomes as high as 500 V–3 kV, thereby non-selectively and physically etching all of the material desired to be etched, as well as its mask material.

In the case of a high density plasma, a second high frequency power supply capable of directly supplying power to the stage is provided in addition to a main high frequency power supply for generating a high density plasma, such that the ion energy to be applied on the specimen can be controlled by adjusting an output from the second power supply. Further, a larger selectivity ratio can be obtained by selection of gases, for example, selecting BCl, gas when etching alumina, and chlorine gas when etching NiFe alloy, in addition to selection of incident ion energy from 50 to 500 V.

Vacuum transport unit 2 has a function to transport a specimen which has been processed in etching processing unit 1 between a processing station (not shown) of the etching processing unit and the load lock chamber 3 or unload lock chamber 4. Atmospheric transport unit 5 has a function to transport the specimen which has been processed between the load lock chamber 3 or unload lock chamber 4 and the plasma post treatment unit 20. Any of the following conventional means may be used as a specimen transport device, such as an arm which is actuated mechanically, electrically or magnetically, and which has a scooper, gripper or absorber to hold a specimen from the bottom, at its periphery or by adsorption due to electromagnetic or vacuum adsorption, or any other means, such as a belt conveyor having a drive gear and a follower gear with an endless belt wound around the both gears, and a blower transport device which transports specimens by an air blower. Vacuum transport unit 2, in case etching process unit 1 is for etching a specimen using a plasma in a vacuum, is provided so as to allow for the specimen which has been etched to be transported in a decompressed space without being exposed to the atmosphere.

Further, atmospheric transport unit 5 is provided for transporting a specimen from the unload lock chamber 4 to the cassette 8 which collects the specimen, and which is mounted on the cassette stage 9.

In the case of etching processing unit 1, which is for processing the specimen using a plasma in a vacuum, both of the decompressed spaces through which a specimen before etching is transported to the etching processing unit 1 and the specimen after having been etched therein is to be transported therefrom are arranged to be in communication with each other and to be closed therebetween. Further, a post treatment atmosphere of plasma post treatment units 20, a space through which the specimen after etching is transported, and a space through which the specimen after the post treatment is transported are arranged to be in communication with each other and to be closed therebetween.

A processing station is provided in the processing atmosphere in the etching processing unit 1. In the case of the etching processing unit 1, which is for processing a specimen using a plasma in a vacuum, its processing station is represented by specimen stage 12. One or more specimens can be mounted on the stage 12.

Figure 5:
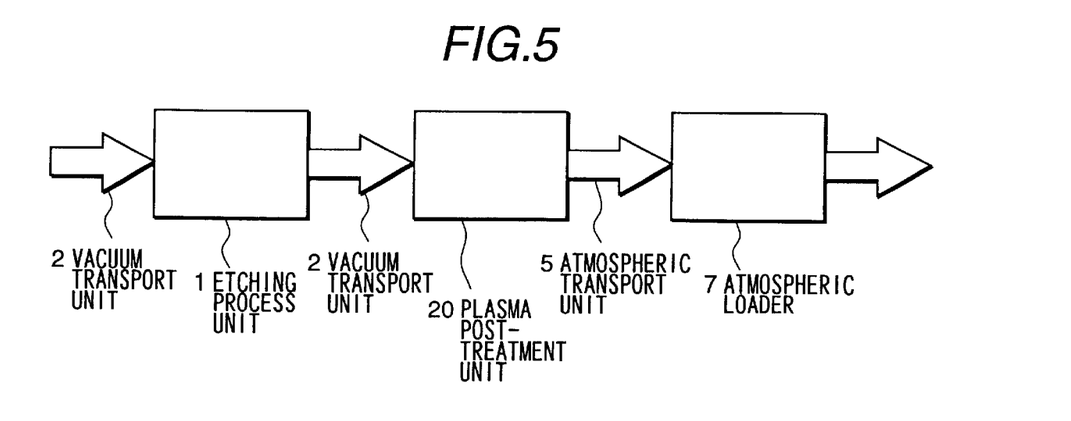
FIG. 5 is a diagram indicative of the process flow in one embodiment of the invention.

With reference to FIG. 5, specimen transport devices, such as vacuum transport device 2 and atmospheric transport unit 5, are provided between etching processing unit 1, plasma post treatment unit 20 and atmospheric loader 7 for transporting the specimen therebetween. Vacuum transport unit 2 is provided with a vacuum transport chamber which includes a vacuum transport robot (not shown) therein.

An example where a magnetic pole for a magnetic head is used as the specimen will be described in the following.

Figure 6:
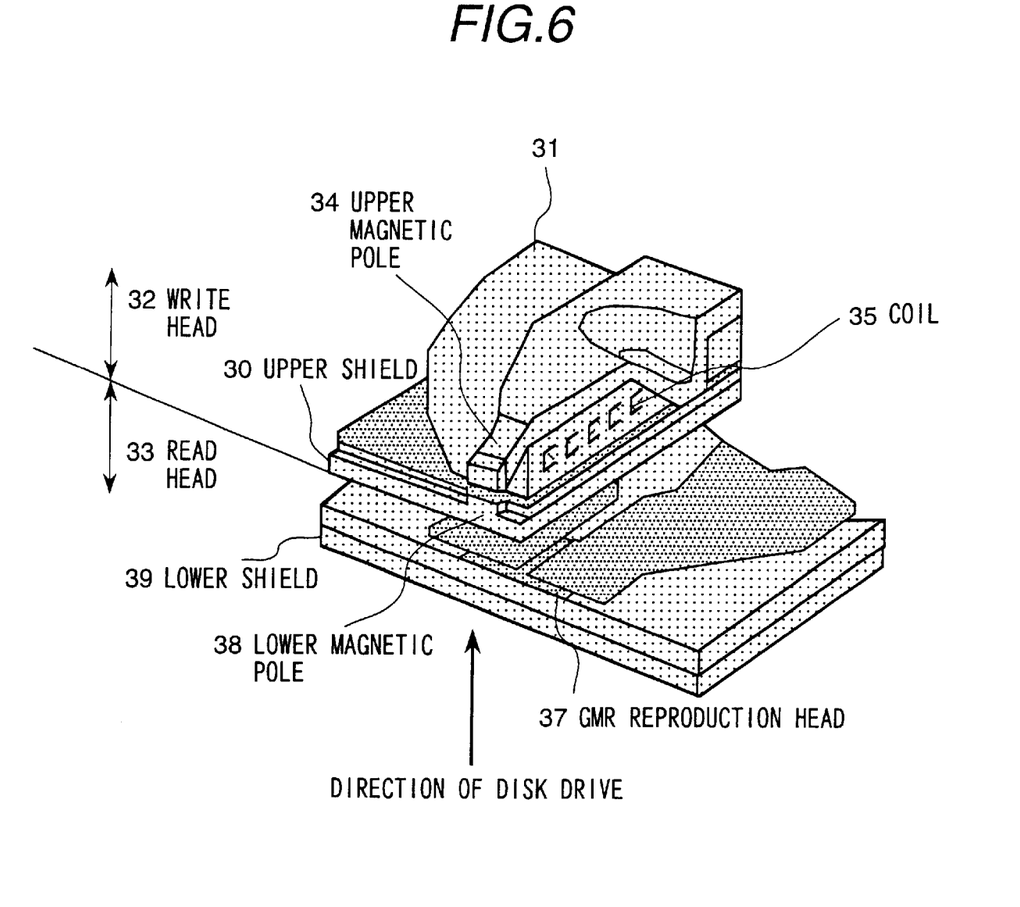
FIG. 6 is a perspective view partly in section of a magnetic head of the invention.

A typical example of a specimen for use in a magnetic head is indicated in FIG. 6. Magnetic head 31 is comprised of a write head 32 and a reproducing (read) head 33, wherein the write head 32 includes an upper magnetic pole 34, a coil 35 and an upper shield 36, wherein the read head 33 includes a GMR read head 37, a lower magnetic pole 38 and a lower shield 39, and wherein the upper and the lower magnetic poles 34 and 38 are manufactured as will be described in the following. By way of example, the arrow in FIG. 6 indicates the sliding direction of the disk.

The embodiment of the invention can be applied preferably to the manufacture of a device having a lamination structure, which includes a layer of NiFe alloy (without containing Al). A method and an apparatus therefor for processing a lamination layer which includes at least one layer of NiFe alloy and a photo resist layer as its mask, if necessary, by a gas plasma which contains, for example, chlorine, in the lamination film etching processing chamber 11 will be described in the following.

Figure 7:
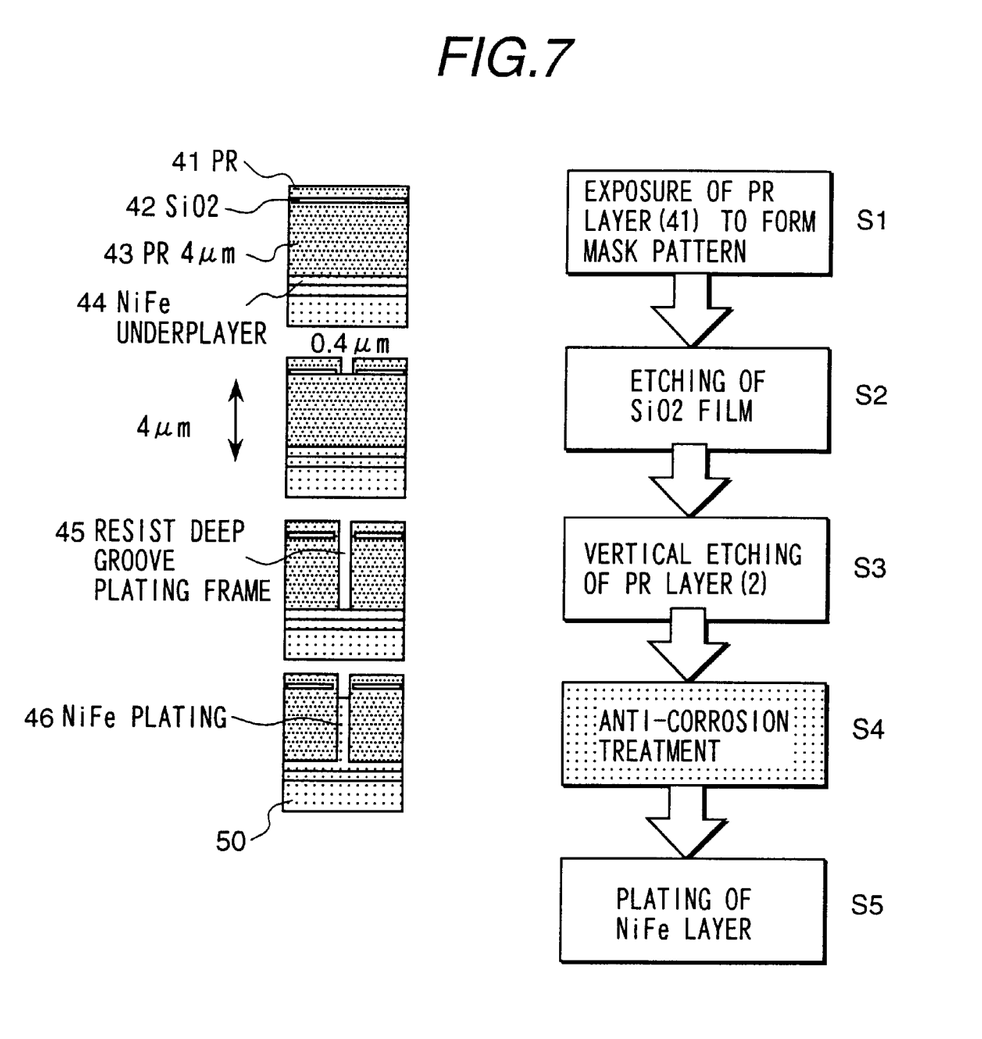
FIG. 7 is a process flow diagram indicative of the steps of manufacture of an upper magnetic pole formed by a three-layer resist etching according to the invention.

With reference to FIG. 7, a step of forming an upper magnetic pole by means of a three-layer resist etching is indicated. A specimen of lamination film 40 is comprised of: an upper photo resist layer (PR) 41 which 0.5–1.0 µm thick; a hard mask layer 42 made of $SiO_2$ or alumina and which is 1000–4000 A thick ($SiO_2$ is shown in FIG. 7); a lower photo resist layer 43 which is 2–60 µm thick; and a seed layer 44 of NiFe alloy which is 1000–3000 A thick (indicated as an under-layer of NiFe film).

In step S1 in FIG. 7, a mask pattern is formed by exposure of the PR layer 41.

Then, in step S2, $SiO_2$ film 42 is subjected to etching. The width of the etching in this instance is set, for example, to be 0.4 µm.

The PR layer, which is, for example, 4 µm thick, is subjected to a vertical etching in step S3. Thereby, a resist deep groove etch plating frame is formed. Namely, a deep groove 45 is formed by plasma processing in the lower photo resist layer using the hard mask layer as its mask with a gas which contains chlorine such that a part of the seed layer 44 is exposed at the bottom of the deep groove. Anti-corrosion treatment is applied to the bottom of this deep groove and to any exposed portions of NiFe in step S4. This anti-corrosion treatment is conducted by plasma post treatment using a gas plasma which contains $H_2$) or methanol.

A residual chlorine compound deposited on the portion of seed layer 44 exposed at the bottom of the deep groove is removed by the plasma post treatment.

Detection of the end of etching in step S2 is done, as indicated in FIG. 3, by sensing emission of plasma through a glass fiber 21 attached to etching processing unit 1, sending its sensed signal to a spectrometer 19 and extracting a spectroscopic emission line, for example, of SiF. Namely, as the etching thereof approaches its end point, the emission level of SiF drops, which can be detected, and the end of the etching can be determined. In the same manner, detection of the end of step S3 can be determined by an emission line of CN if CO or $N_2$ gas is added to its etching gas.

After that, a NiFe alloy is embedded into the deep groove by plating, CVD or sputtering methods (an example of NiFe layer 46 formed by plating is shown in the figure) in contact with the seed layer 44 so as to form the upper magnetic pole.

Figure 8:
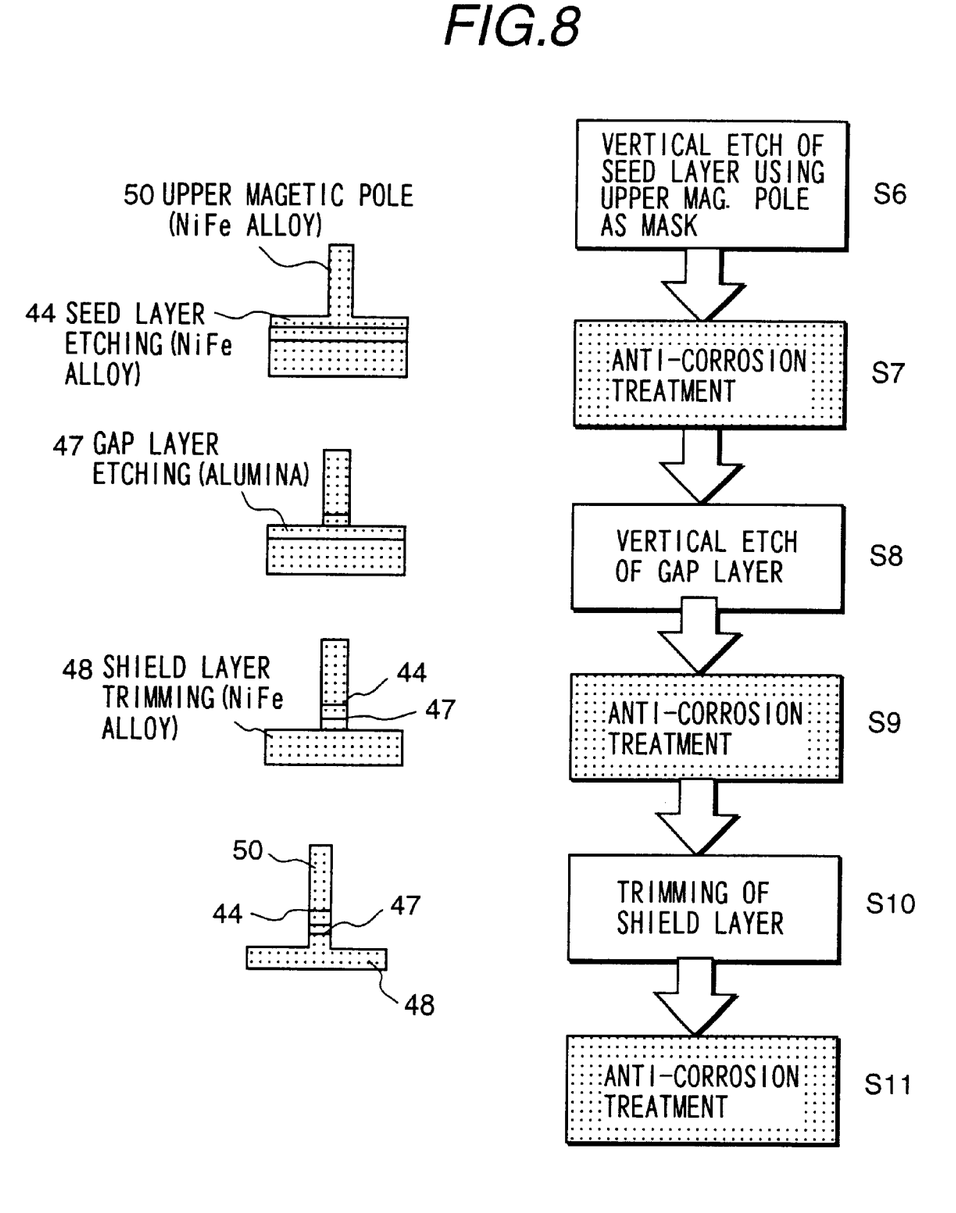
FIG. 8 is a process flow diagram indicative of the steps of manufacture of a seed layer of NiFe, a gap layer of $Al_2O_3$ and a shield under-layer of NiFe, which are formed by a vertical processing according to the invention.

Further, a vertical processing method for vertically processing seed layer 44, gap layer 47 and shield layer 48 is shown in FIG. 8. An example shown in FIG. 8 uses a seed NiFe layer as its seed layer, a gap Al2O3 layer as its gap layer, and an under-layer NiFe shield layer as its shield layer.

In FIG. 8, the seed layer 44 made of NiFe alloy, the upper magnetic pale 50 made of NiFe alloy in close contact with the seed layer 44, the gap layer 47 made of an oxide film in close contact with the seed layer 44, and the shield layer 48 made of NiFe alloy in close contact with the gap layer 47 constitute a lamination film 51.

The seed layer 44 serves as a contact layer for the upper 10 magnetic pole. The gap layer 47 is formed using an oxide film such as alumina or SiO2/TaO.

A Cr-containing NiFe alloy contact layer, prior to forming magnetic head layer, is subjected to plasma etching by applying gas containing a chlorine gas and a rare gas such as argon in step S6. In this case, a vertical etching is applied to the seed layer 44 using the upper magnetic pole 50 as its mask. Then, a plasma post treatment using a gas plasma which contains $H_2O$ or methanol is carried out in order to remove a residual etching product and residual chlorine compound remaining after the etching for corrosion prevention in step S7.

In case the gap layer 47 is alumina, its plasma-etching is conducted using a gas of $BCl_3/Cl_2$ in step S8. In this case, a vertical etching of gap layer 47 is carried out using upper magnetic pole 50 as its mask. in case the gap layer 47 is SiO2, its plasma etching is conducted using a fluorine gas.

After that, a plasma post treatment using a gas plasma which contains H2O or methanol is conducted in order to remove a residual etching product and residual chlorine compound remaining after the etching for corrosion prevention in step S9.

Then, a process for trimming the shield layer 48 is conducted by plasma etching using a chlorine gas in step S10. In this case, the shield layer is vertically etched using the upper magnetic pole 50 as its mask. By this trimming, an intermediate magnetic pole 49 having the same cross-section as that of the upper magnetic pole 50 can be formed.

After that, a plasma post treatment using a gas plasma which contains H2O or methanol is applied in order to remove a residual etching product and a residual chlorine compound for corrosion prevention in step SII. According to the invention, immediately after the gas plasma etching of the first step, the plasma post treatment using the gas plasma, which contains H2O or methanol of the second process, is carried out consecutively for corrosion prevention.

The gas plasma according to the invention can be produced, in addition to the chlorine gas, also using at least one gas selected from the group consisting of $BCL_3$, Ar, $O_2$, or in combination therebetween, as described above.

The gas plasma etching process according to the invention is conducted at a temperature below 200° C. to room temperatures (or below that, if necessary).

The specimen of the invention to be subjected to gas plasma etching in the process chamber includes, in addition to the NiFe alloy, at least one or more of the following, (A) a photo resist layer,
(B) an alumina (Al2O3) layer,
(C) a silicon oxide layer,
(D) a Cu layer, and
(E) a Ta layer.

The above-mentioned substrate is an Al2O3/TiC substrate, and a lamination made of NiFe alloy is formed on the substrate, which is subjected to gas plasma etching in the processing chambers.

The upper magnetic pole 50 is provided by forming the PR layer/Al2O3 or SiO2 layer/NiFe alloy seed layer to have a thickness of 1 µm/0.5–1.0 µm/2–4 µm, respectively, wherein Al2O3 is etched using a chlorine gas, SiO2 is etched using a f fluoride gas, and the seed layer made of NiFe alloy is etched using a high density gas plasma containing chlorine and argon gases. Here, the high density is defined to be 1–10 $mA/cm^2$, and the low density is defined to be 0.1–1 $mA/cm^2$ (ion saturated current density).

In FIG. 8, etching of the NiFe film is done using a gas whose main component is chlorine. In this case, a large ratio of etching rate (selectivity ratio) can be obtained relative to the under-layer of alumina. This is because, with the gas compound consisting mainly of chlorine, the alumina film is hardly etched. In contrast, when etching the alumina film, etching using a gas, which mainly contains BCl3, is done. This is because a reaction proceeds such that alumina Al2O3+2BCl3 AlCl3+B2O3, and both of AlCl3 and B2O3 evaporate in vacuum, thereby expediting the etching process. At this time, with BCl3 gas, its etching rate for NiFe film is low, therefore a high selectivity ratio can be obtained relative to the mask NiFe, or the under-layer NiFe films. In the argon ion milling method, this type of stoichiometric etching mechanism does not occur, thereby suppressing the processing to a low selectivity ratio in both cases of etching NiFe and alumina.

Detection of end points of etching in respective steps of FIG. 8 is carried out in the following manner. In the etching of the NiFe layer in step S6, an emission line of Fe is monitored. In the etching of the alumina film, an emission line of Al is monitored. In the process of trimming the NiFe layer in step S10, an etching period of time is estimated and controlled on the basis of etching rates measured in advance.

Because the NiFe alloy is used for the layer according to the invention, and because the high density and low energy irradiation ion method is adopted, a form of chlorine which is produced by etching and remains as a residual is considered to be a physical/chemical adsorption of chlorine on the surface of the alloys exposed.

Figure 9:
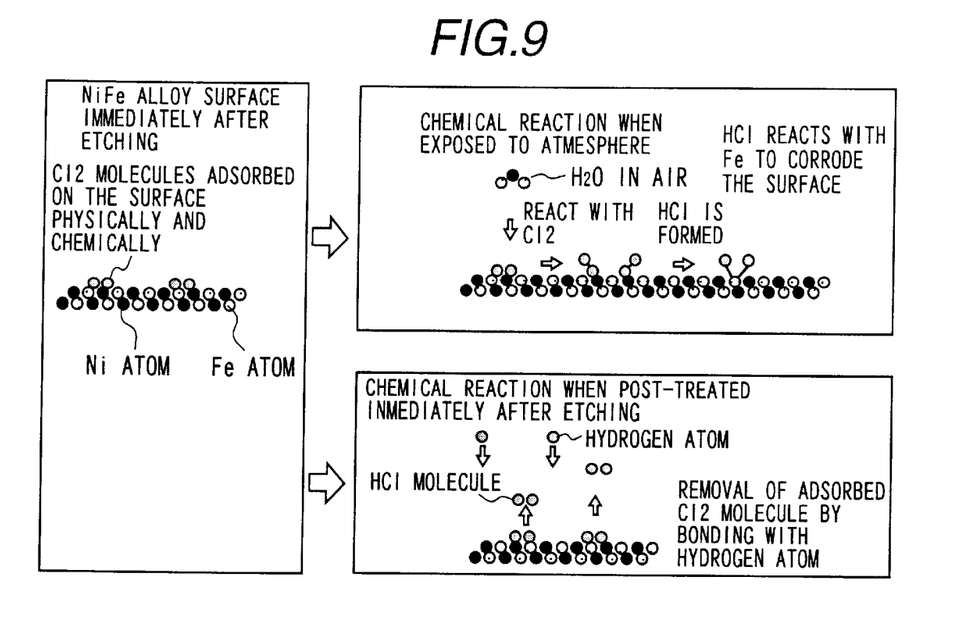
FIG. 9 is a diagram indicative of the effect obtained by the post-plasma treatment according to the invention.

FIG. 9 illustrates the action and its effect of the plasma post treatment according to the invention. As indicated in the drawing, chlorine molecules are adsorbed physically/chemically on the surface of NiFe alloy immediately after the etching. When exposed to the atmosphere, a chemical reaction proceeds between water molecules in the atmosphere and the chlorine molecules to form HCl, which HCl reacts with Fe to corrode the surface of the alloy. In contrast, according to the invention, the adsorption chlorine molecules are caused to react with plenty of hydrogen atoms dissociated by the plasma of a relatively high pressure from 50 to 200 Pa to form HCl molecules. The HCl molecules, however, separate from the surface readily as a vapor phase, thereby successfully removing the chlorine molecules. Namely, extraction of the chlorine molecules from the surface is executed in this manner. This reaction proceeds faster with an increasing temperature of the specimen, however, it proceeds fast enough in practice even at a temperature below 200° C. that does not destroy the specimen. Thereby, without applying any specific post treatment to the residual-etching product resulting from the high-density gas plasma etching other than plasma post treatment for removing residual chlorine compound of the invention, satisfactory corrosion prevention can be effectuated.

Figure 10:
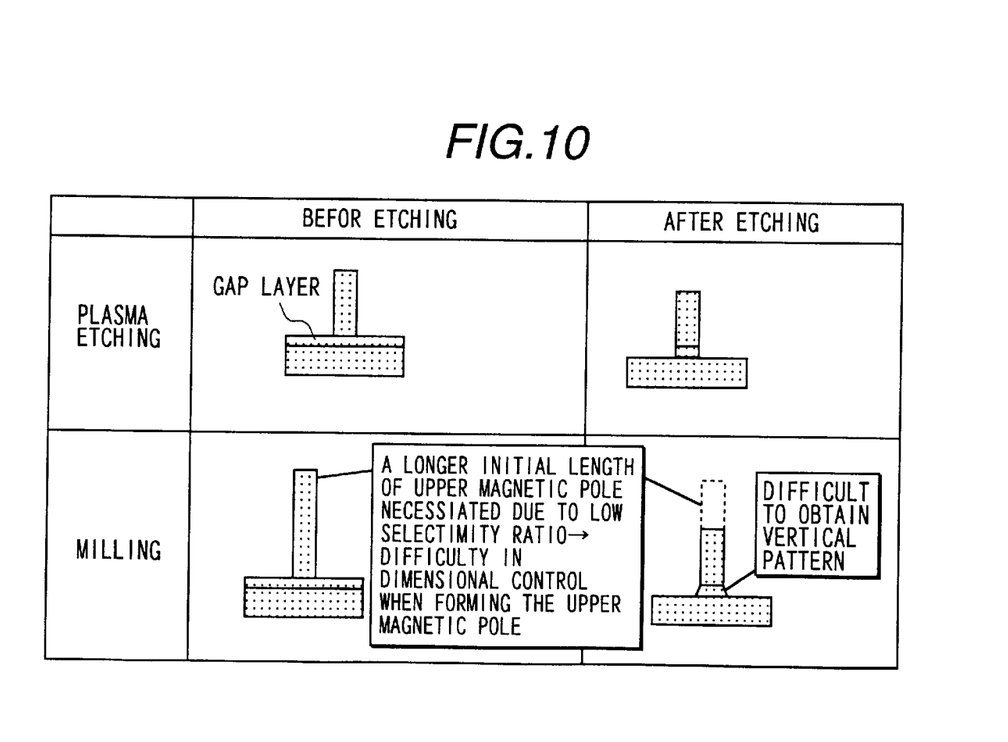
FIG. 10 is a table which compares advantages between the present invention and the prior art.

FIG. 10 compares dimension control characteristics of the upper magnetic pole between the plasma etching and the ion milling methods. When the ion milling or low-density plasma methods are used, only a low selectivity ratio is obtained relative to its mask. For example, while a selectivity ratio of only 0.2–1.0 is obtained when etching Al2O3 with a mask material of NiFe using a low-density plasma, a selectivity ratio as high as 1.0 to 10.0 can be obtained when a high-density plasma is used. This is because, in the case of the low density plasma, the ion energy incident on a specimen tends to become as high as 500 V to 3 kV, thereby non-selectively and physically etching both of the materials which are desired to be etched and the mask material without discrimination.

In the case of high density plasma etching, as indicated in FIG. 3, the second high frequency power source that can apply power directly to the specimen stage is provided usually in addition to the first high frequency power source that is provided for producing a high density plasma, and it is arranged such that by controlling an output from the second power source, ion energy incident on the specimen is controlled appropriately. By setting its incident ion energy at a low level from 50 to 500 V, and at the same time, selecting an appropriate gas depending on the materials, such as BCl3 gas in alumina etching, or chlorine gas in NiFe alloy etching, a greater selectivity ratio can be attained.

In the milling or low density etching methods described above, because of the low selectivity ratio, the upper magnetic pole must have a larger length at the start of milling or etching. That is, the quantity of etching for the upper magnetic pole becomes inevitably large. Thereby, it becomes difficult for the dimensional control to be assured when forming the upper magnetic pole. Further, because it is difficult to ensure a vertical shape of the gap layer to be obtained when etching the same (as a sputtered substance deposits on the side wall thereof to form a tapering), the specimen must be subjected to tilted milling in which it is tilted in various directions in order to obtain the vertical shape.

In contrast, according to the one preferred embodiment of the invention, by applying a process of high density plasma etching to the seed layer, gap layer and shield layer simply in a vertical direction using the upper magnetic pole as a mask, then applying the corrosion prevention process in order to remove the residual chlorine compound deposited on the surface of the materials, the vertical shape of the gap layer as indicated in FIG. 10 can be obtained. Further, the vertical shape of the intermediate magnetic pole having the same cross-section as the upper magnetic pole can be formed.

As described heretofore, according to the invention, a NiFe alloy layer is formed in the lamination film that constitutes the specimen, and this alloy layer is subjected to etching process using a high density gas plasma, therefore, an adverse effect by the residual etching product due to different ionization tendencies is eliminated, and then, by applying the plasma:post treatment for corrosion prevention using a gas which contains H2O or methanol immediately after the etching process, corrosion of the specimen can be prevented. Therefore, such advantages can be obtained that when the specimen is the upper magnetic pole, vertical processing of the upper magnetic pole becomes substantially easy, and its vertical shape is ensured to be retained in the atmosphere, and thereby a design of the specification of a track width, which is one of the major parameters that determine the basic performance of the magnetic head, can be secured adequately.

What is claimed is:

1. A method of processing a specimen comprising the steps of:
   a first step of etching a specimen of lamination film formed on a substrate using a first gas plasma which contains chlorine in an etching chamber at a temperature below 200° C. of the specimen, said lamination film including at least one layer of NiFe alloy or NiFeCo alloy; and
   a second step of plasma post processing for removing a residual chlorine compound deposited on a surface of said lamination film which is exposed by said first step using a second gas plasma which contains H$_2$O or methanol under pressure of 50 Pa or more, and at a temperature below 200° C. of the specimen.

2. The method of processing a specimen according to claim 1, wherein said first gas plasma is produced using at least one gas selected from the group consisting of Cl2, BCl3, Ar and O2, or a combination therebetween.

3. The method of processing a specimen according to claim 1, wherein said lamination film further includes at least one of the following, which is to be processed by gas the plasma etching in said processing chamber,
   (A) a photo resist layer,
   (B) an alumina (Al2O3) layer,
   (C) a silicon oxide layer, (D) a Cu layer,
(E) a Ta layer, and
(F) a Cr layer.

4. The method of processing a specimen according to claim 1, wherein said substrate is a sintered substrate composed of Al2O3 and TiC, and a layer of NiFe alloy is formed on said substrate, which is subjected to the gas plasma etching in a process chamber.

* * * * *